(12) United States Patent
Pribyl

(10) Patent No.: US 6,845,167 B2
(45) Date of Patent: Jan. 18, 2005

(54) CONTACTING ARRANGEMENT FOR AN ELECTROACOUSTIC MICROPHONE TRANSDUCER

(75) Inventor: Richard Pribyl, Fischamend (AT)

(73) Assignee: AKG Acoustics GmbH, Vienna (AT)

( * ) Notice: Subject to any disclaimer, the term of this patent is extended or adjusted under 35 U.S.C. 154(b) by 0 days.

(21) Appl. No.: 10/374,661

(22) Filed: Feb. 26, 2003

(65) Prior Publication Data
US 2003/0165252 A1 Sep. 4, 2003

(30) Foreign Application Priority Data
Feb. 26, 2002 (AT) ............................................ A 291/02

(51) Int. Cl.⁷ .............................................. H04R 25/00
(52) U.S. Cl. ........................ 381/409; 381/174; 381/410
(58) Field of Search ................................ 381/174, 113, 381/116, 191, 409–410, 355, 361, 365, 369, 170, 189; 310/334, 324; 439/65, 67; 361/749; 379/433, 370

(56) References Cited

U.S. PATENT DOCUMENTS

| | | | |
|---|---|---|---|
| 4,291,202 A | | 9/1981 | Adams et al. |
| 5,193,116 A | * | 3/1993 | Mostardo ..................... 381/324 |
| 6,011,699 A | | 1/2000 | Emmert et al. |
| 6,324,907 B1 | * | 12/2001 | Halteren et al. .............. 73/431 |
| 6,352,434 B1 | * | 3/2002 | Emmert ........................ 439/65 |

* cited by examiner

Primary Examiner—Huyen D. Le
(74) Attorney, Agent, or Firm—Friedrich Kueffner

(57) ABSTRACT

An electroacoustic microphone transducer operating electrostatically has a microphone capsule, a flexprint, and a high-resistance pre-amplifier mounted on the flexprint and arranged in the microphone capsule. A post amplifier is arranged on a printed board. The flexprint has at least one part projecting past a cross-section of the microphone capsule. The flexprint is connected directly to the printed board of the post amplifier.

6 Claims, 2 Drawing Sheets

CONTACTING ARRANGEMENT FOR AN ELECTROACOUSTIC MICROPHONE TRANSDUCER

BACKGROUND OF THE INVENTION

1. Field of the Invention

The invention relates to electroacoustic microphone transducer, functioning according to the electrostatic principle, comprising a high-resistance pre-amplifier arranged in the microphone capsule on a printed board and a post-amplifier arranged also on a printed board.

2. Description of the Related Art

Electroacoustic microphone transducers functioning according to the electrostatic principle have two metal surfaces forming the electrodes of an electric capacitor. The movable electrode is a diaphragm that is mounted with its edge so as to vibrate freely and is usually simply referred to as diaphragm. The stationary electrode is simply referred to as electrode and is manufactured of an electrically conducting material and provided with several openings. It is immobile and, because of its perforations, allows sound to pass through. The changes of the sound pressure acting on the diaphragm of the microphone transducer cause the movement of the diaphragm and thus the changes of the electrical capacitance of the microphone transducer.

In order to be able to transform the changes of the electrical capsule capacitance into the voltage changes at the output terminals of the microphone, it is necessary to generate an electrical field between the electrodes of the microphone capsule. This can be done in two ways. Either a so-called polarization voltage is generated between the electrodes of the microphone capsule by means of a voltage source (this is referred to as capacitor transmitter) or, by means of a material that has excellent electrical insulating properties (for example, Teflon®), one of the electrodes is provided permanently with charges and the applied layer is used as an electrical charge carrier and storage device (this is a so-called electret transducer).

Both configurations have in common that the transducer system, when viewed electrically, has high resistance. This means that the amplifier arranged downstream must firstly also be configured with a high-resistance input impedance and, secondly, for the purpose of electromagnetic shielding, the amplifier must be mounted in direct vicinity of the microphone capsule. The last condition is adhered to so strictly that the first stage of the microphone amplifier, as a so-called impedance transducer, is arranged in the housing of the microphone capsule itself. Such a configuration according to the prior art is illustrated in FIG. 1 and will be discussed in the following.

An electrostatic microphone capsule configured in this way has at least two electrical contacts or terminals. With these contacts, the microphone capsule is connected to the amplifier. Contacting can be realized by solder contacts or terminal contacts. Both types of contacting have in common that they increase the costs of the microphone capsule and, primarily, they represent a source of malfunctions.

SUMMARY OF THE INVENTION

It is an object of the present invention to improve electrical contacting of microphone capsules which operate according to the electrostatic transducer principle and to reduce the production costs.

In accordance with the present invention, this is achieved in that the high-resistance pre-amplifier is arranged on a flexprint, in that the flexprint projects past the cross-section of the transducer and is directly connected to printed board of the post amplifier. This eliminates the twin cable, forming a separate component and required in the prior art as a connection between the two printed boards; this furthermore reduces the malfunction rate of the double contacting arrangement of the cable (two-pole cable or two simple single-pole cables).

In one embodiment it is proposed to arrange the post amplifier also on a correspondingly geometrically shaped flexprint so that any kind of contacting problem is eliminated and assembly is simplified also.

In a particularly preferred embodiment, the flexprint is geometrically configured such that the transducer and the capsule can be mounted by means of the flexprint in the housing. This is possible because of the mechanical properties of the material of which such flexprints are comprised (currently usually polyimide or polycarbonate).

DESCRIPTION OF THE PREFERRED EMBODIMENTS

Figure 1:
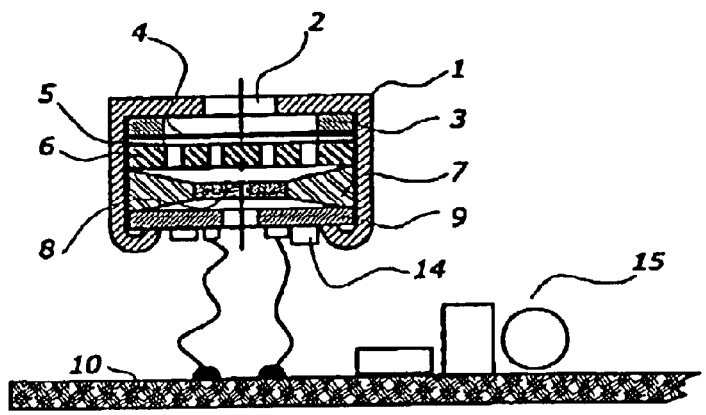
FIG. 1 shows an arrangement according to the prior art.

The electroacoustic capsule according to the prior art is illustrated in FIG. 1. A cup-shaped capsule housing 1 has at its front side at least one sound opening 2. In the interior of the microphone capsule a diaphragm ring 3 with a diaphragm 4 is arranged. An annular spacer 5 provides the required spacing between the diaphragm 4 and a perforated electrode 6. In order to be able to provide the correct acoustic capsule tuning, a so-called friction pill 7 can be provided. It is usually made of plastic material and has at least one opening which is covered by a porous material 8.

The microphone capsule is closed at the rear by an electric printed board 9 on which the electronic components of the first stage of the amplifier (pre-amplifier) are arranged. The printed board 9 has at least one opening in order to ensure that the sound waves reach the diaphragm also from the rear. The printed board has solder contacts which are connected by soldering directly to connecting wires or to plug-shaped contact terminals. The microphone capsule produced in this way is electrically connected to a post-amplifier which is provided within a microphone or another device (mobile or wireless telephone, dictation device or other sound recording device), wherein the post-amplifier is provided on an electronic printed board 10.

Figure 2:
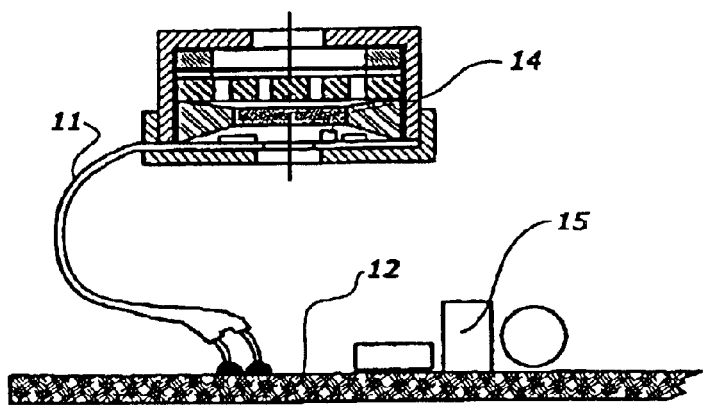
FIG. 2 shows a first embodiment according to the invention.

The solution according to the present invention of the problem described above is illustrated in FIG. 2. The configuration of the capsule corresponds substantially to the configuration of the capsule illustrated in FIG. 1 wherein, however, according to the present invention the printed board 9 (FIG. 1) is replaced by a so-called flexprint 11. The flexprint, in the same way as in the prior art, is used for configuring the first stage of the amplifier (pre-amplifier 14). It has however such a length, preferably by providing a thin projection, that its length is sufficient to provide a direct connection (without additional wires) to the post amplifier 15 on the print board 12. The two ends of the flexprint 11 can be soldered directly onto the print board 12 of the post amplifier 15, or contacting can be realized by means of a conventional plug connection.

Figure 3:
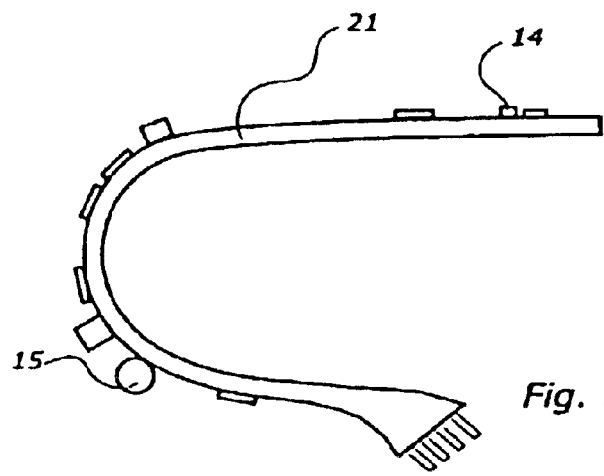
FIG. 3 shows a particularly preferred embodiment of the invention in a side view without the microphone capsule.

FIG. 3 shows purely schematically and without showing the capsule a further solution according to the invention. In this configuration, the flexprint 21 has such a size that the post amplifier 15 can be mounted also on the flexprint 21 (but outside of the capsule area). In this way, not only the first stage of the amplifier (pre-amplifier 14) can be connected permanently electrically with the microphone capsule but the post amplifier 15 can also be integrated with the microphone capsule to form a modular component.

Figure 4:
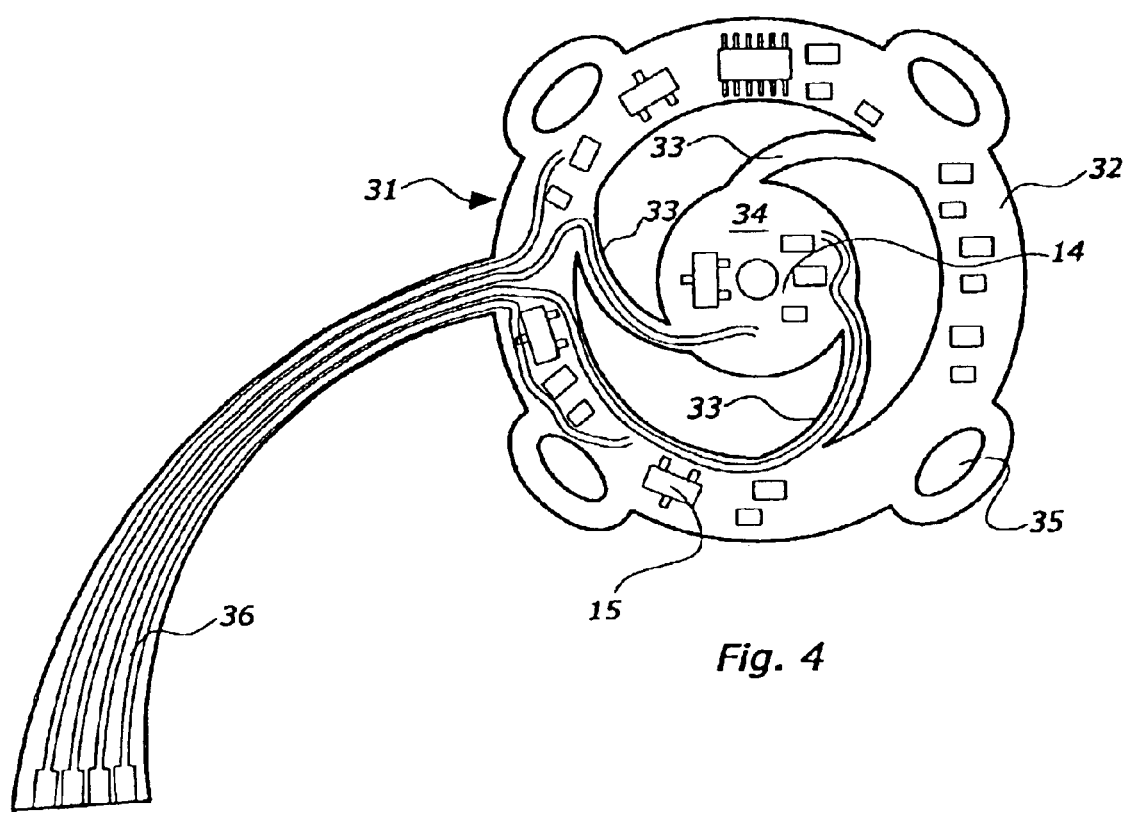
FIG. 4 shows another embodiment in a plan view, also without microphone capsule.

FIG. 4 shows a further especially preferred solution of the present invention. The flexprint 31 is designed geometrically such that the mechanical support of the microphone capsule (not illustrated) can be realized with it. The microphone capsule is positioned in the central area 34 and is mechanically supported by three arms 33 of the flexprint 31.

Microphone transducers must often be mounted in different devices in such a way such that they can mechanically vibrate or swing freely in the interior of the device (within preset limits). This is necessary for minimizing the structure-borne sound. For these purposes, the mass of the microphone capsule is adjusted to the mechanical elasticity of the support such that the mechanical resonance frequency of the system microphone capsule/microphone support is as low as possible or outside of the frequency range to be transmitted.

According to the invention, the flexprint 31 (FIG. 4) is configured such that it supports mechanically freely the capsule. For this purpose, the flexprint 31 has at least two arms 33 which are mounted on the device, for example, by means of fastening locations in the form of oval openings 35, provided on the outer rim and secure the capsule in this way. In FIG. 4 a preferred variant is illustrated where three arms 33 are uniformly arranged about the circumference and have outer ends with a monolithic transition into an annular flexprint part 32 so that mounting of the entire unit is facilitated. For improving the mechanical vibration behavior, the arms 33 are curved and not precisely radially aligned.

In this embodiment of the invention, it is also possible to provide the post amplifier 15, in analogy to the configuration of FIG. 3, on the flexprint 31 either on annular flexprint part 32 (as mentioned above) or an area (not illustrated) opposite the main cable 36 which then has more than two conductors, if necessary.

The invention is not limited to the illustrated embodiments but can be modified in various ways. For example, in the embodiment with mechanical support of the capsule by the flexprint, the arms 33 must not be connected by the annular part 32 and, depending on the mounting situation, the arms can have different lengths and/or can be arranged irregularly relative to the axis of the capsule. It is also possible to guide the conductors for the signals in different arms and, if needed, their contacting can be realized by fastening means (screws, rivets, electrically conducting adhesive, etc.); this eliminates extra components and extra assembly steps.

While specific embodiments of the invention have been shown and described in detail to illustrate the inventive principles, it will be understood that the invention may be embodied otherwise without departing from such principles.

What is claimed is:

1. An electroacoustic microphone transducer operating electrostatically, comprising:
    a microphone capsule having a housing;
    a flex print;
    a high-resistance pre-amplifier mounted on the flexpint and arranged in the microphone capsule;
    a post amplifier arranged on a printed board;
    wherein the flexprint has at least one part projecting past a cross-section of the microphone capsule;
    wherein the flexprint is connected directly to the printed board of the post amplifier; and
    wherein the flexprint has at least two arms projecting past the cross-section of the microphone capsule and extending to fastening locations provided for mechanically supporting the flexprint and the capsule housing.

2. The microphone transducer according to claim 1, wherein the printed board of the post amplifier is the flexprint.

3. The microphone transducer according to claim 1, wherein the flexprint has an outer annular part provided with the fastening locations and wherein the arms have outer ends connected to the outer annular part of the flexprint.

4. The microphone transducer according to claim 1, wherein the flexprint has an elongate projection connected to a device in which the microphone transducer is mounted.

5. An electroacoustic microphone transducer operating electrostatically, comprising:
    a microphone capsule having a housing;
    a flex print;
    a high-resistance pre-amplifier mounted on the flexpint and arranged in the microphone capsule;
    a post amplifier arranged on a printed board;
    wherein the flexprint has at least one part projecting past a cross-section of the microphone capsule;
    wherein the flexprint is connected directly to the printed board of the post amplifier; and
    wherein the flexprint has three arms projecting past the cross-section of the microphone capsule and extending to fastening locations provided for mechanically supporting the flexprint and the capsule housing.

6. The microphone transducer according to claim 5, wherein the flexprint has an outer annular part provided with the fastening locations and wherein the arms have outer ends connected to the outer annular part of the flexprint.

\* \* \* \* \*